(12) United States Patent
Matsuyama et al.

(10) Patent No.: US 10,531,567 B2
(45) Date of Patent: *Jan. 7, 2020

(54) ENTRY SHEET FOR DRILLING

(71) Applicant: Mitsubishi Gas Chemical Company, Inc., Tokyo (JP)

(72) Inventors: Yousuke Matsuyama, Yamagata (JP); Takaaki Ogashiwa, Yamagata (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/300,629

(22) PCT Filed: Mar. 30, 2015

(86) PCT No.: PCT/JP2015/059950
§ 371 (c)(1),
(2) Date: Sep. 29, 2016

(87) PCT Pub. No.: WO2015/152162
PCT Pub. Date: Oct. 8, 2015

(65) Prior Publication Data
US 2017/0111997 A1    Apr. 20, 2017

(30) Foreign Application Priority Data
Mar. 31, 2014  (JP) .................................. 2014-072337

(51) Int. Cl.
*H05K 3/00* (2006.01)
*B26D 7/08* (2006.01)
*B26F 1/16* (2006.01)

(52) U.S. Cl.
CPC ............ *H05K 3/0047* (2013.01); *B26D 7/08* (2013.01); *B26D 7/088* (2013.01); *B26F 1/16* (2013.01); *H05K 2203/0214* (2013.01); *H05K 2203/127* (2013.01)

(58) Field of Classification Search
CPC .. H05K 3/0047; H05K 2203/127; B26F 1/16; B26D 7/088
See application file for complete search history.

(56) References Cited

U.S. PATENT DOCUMENTS

| 3,608,054 | A | * | 9/1971 | Alvino ..................... B05D 5/08 264/309 |
| 4,195,550 | A | | 4/1980 | Witt et al. |
| 4,243,434 | A | | 1/1981 | Hartley et al. |
| 4,329,238 | A | | 5/1982 | Mitrofanova et al. |
| 4,772,496 | A | | 9/1988 | Maeda et al. |
| 4,915,550 | A | | 4/1990 | Arai et al. |
| 5,082,402 | A | | 1/1992 | Gaku et al. |
| 5,173,204 | A | | 12/1992 | Chiddick et al. |
| 5,427,698 | A | | 6/1995 | Hirokawa et al. |
| 5,435,671 | A | | 7/1995 | Weinreich |
| 5,985,080 | A | | 11/1999 | Kobayashi et al. |
| 10,159,153 | B2 | | 12/2018 | Kamei et al. |
| 2002/0003991 | A1 | | 1/2002 | Ohashi et al. |
| 2003/0100456 | A1 | | 5/2003 | Hasaki et al. |
| 2003/0129030 | A1 | | 7/2003 | Johnston |
| 2004/0209091 | A1 | | 10/2004 | Izumi et al. |
| 2005/0003169 | A1 | * | 1/2005 | Ikeguchi ................. B23B 35/00 428/195.1 |
| 2007/0231562 | A1 | | 10/2007 | Hsiao |
| 2007/0281181 | A1 | | 12/2007 | Akita et al. |
| 2008/0100291 | A1 | | 5/2008 | Mayder |
| 2008/0292860 | A1 | | 11/2008 | Yagishita |
| 2009/0095511 | A1 | | 4/2009 | Iida et al. |
| 2010/0167041 | A1 | | 7/2010 | Matsuyama et al. |
| 2010/0230382 | A1 | | 9/2010 | Narahashi et al. |
| 2011/0285124 | A1 | | 11/2011 | Pinel et al. |
| 2012/0024586 | A1 | | 2/2012 | Yoshimura et al. |
| 2013/0189043 | A1 | | 7/2013 | Uchiuzo et al. |
| 2015/0072122 | A1 | | 3/2015 | Kamei et al. |
| 2016/0045961 | A1 | | 2/2016 | Umehara et al. |
| 2016/0264745 | A1 | | 9/2016 | Du et al. |

FOREIGN PATENT DOCUMENTS

| CN | 101081389 A | 12/2007 |
| CN | 102049550 A | 5/2011 |
| CN | 103554844 A | 2/2014 |
| DE | 102010031130 A1 | 1/2012 |
| EP | 0687715 B1 | 10/2001 |

(Continued)

OTHER PUBLICATIONS

Machine Translation of Yousuke et al, WO 2011/158510 A1, 2011, p. 1-22.*
Machine Translation of Takayuki et al, WO 2012/091179 A1, 2012, p. 1-14.*
Molyneux, P.; Water-Soluble Synthetic Polymers: Properties and Behavior, vol. 1, 1987, p. 19-72.*
Gagnon, S.D.; Kirk-Othmer Encyclopedia of Chemical Technology; Polyethers, Propylene Oxide Polymers, 2000, p. 1-19.*
International Search Report dated Jun. 30, 2015 for PCT/JP2015/059950 and English translation of the same (6 pages).
"Function & Application of Water Soluble Polymer" written by Teruo Horiuchi in Japanese.
CP Kelco, Carboxymethylcellulose Book, 2009, pp. 1-26.
Garcia et al. "Study of the solubility and stability of polystyrene wastes in a dissolution recycling process", Waste Management 29(6), 2009, pp. 1814-1818.

(Continued)

*Primary Examiner* — Robert S Jones
(74) *Attorney, Agent, or Firm* — Fitch, Even, Tabin & Flannery LLP

(57) ABSTRACT

The present invention provides an entry sheet for drilling which provides higher hole position accuracy than that of a conventional entry sheet for drilling. The present invention provides an entry sheet for drilling, including a metal foil, and a layer including a resin composition and formed on at least one surface of the metal foil, wherein the resin composition includes a resin and tungsten disulfide as a solid lubricant, and the content of the tungsten disulfide included in the resin composition is 10 parts by mass to 200 parts by mass based on 100 parts by mass of the resin included in the resin composition.

18 Claims, 6 Drawing Sheets

(56) References Cited

FOREIGN PATENT DOCUMENTS

| | | |
|---|---|---|
| EP | 1174006 B1 | 8/2004 |
| JP | S62-114245 A | 5/1987 |
| JP | S63-277298 A | 11/1988 |
| JP | H04-092494 A | 3/1992 |
| JP | H05-169400 A | 7/1993 |
| JP | H06-17847 U | 3/1994 |
| JP | H06-504956 A | 6/1994 |
| JP | H06-077920 U | 11/1994 |
| JP | H08-281508 A | 10/1996 |
| JP | H10-180501 A | 7/1998 |
| JP | H11-335972 A | 12/1999 |
| JP | 2000-61896 A | 2/2000 |
| JP | 2000-334697 A | 12/2000 |
| JP | 2001-328015 A | 11/2001 |
| JP | 3251082 B2 | 11/2001 |
| JP | 2002-038255 A | 2/2002 |
| JP | 2002-210608 A | 7/2002 |
| JP | 2002-292599 A | 10/2002 |
| JP | 2003-94217 A | 4/2003 |
| JP | 2003-94389 A | 4/2003 |
| JP | 2003-136485 A | 5/2003 |
| JP | 2003-175412 A | 6/2003 |
| JP | 2003-225814 A | 8/2003 |
| JP | 2003-301187 A | 10/2003 |
| JP | 2004-230470 B2 | 8/2004 |
| JP | 2009-172755 A | 8/2004 |
| JP | 2004-338271 A | 12/2004 |
| JP | 2005-028861 A | 2/2005 |
| JP | 2005081508 A | 3/2005 |
| JP | 2006-150557 A | 6/2006 |
| JP | 3134127 U | 7/2007 |
| JP | 3134128 U | 8/2007 |
| JP | 2007-281404 A | 10/2007 |
| JP | 2008-034358 A | 2/2008 |
| JP | 2008-183626 A | 8/2008 |
| JP | 2008-222762 A | 9/2008 |
| JP | 2009-18385 A | 1/2009 |
| JP | 2009-39810 A | 2/2009 |
| JP | 2009-099624 A | 5/2009 |
| JP | 2009-176605 A | 8/2009 |
| JP | 3153156 U | 8/2009 |
| JP | 2009-241239 A | 10/2009 |
| JP | 2003-26945 A | 12/2009 |
| JP | 2010-158736 A | 7/2010 |
| JP | 2010-179379 A | 8/2010 |
| JP | 2010-540260 A | 12/2010 |
| JP | 2011-56583 A | 3/2011 |
| JP | 4782222 B2 | 7/2011 |
| JP | 4798308 B2 | 8/2011 |
| JP | 2012-016793 A | 1/2012 |
| JP | 2012-146880 A | 8/2012 |
| JP | 2012-210689 A | 11/2012 |
| JP | 2012-223882 A | 11/2012 |
| JP | 3181967 U | 2/2013 |
| TW | 201043362 A | 12/2010 |
| TW | 201100588 A | 1/2011 |
| TW | 201404258 A | 1/2014 |
| WO | 92/14346 A1 | 8/1992 |
| WO | 2009/045932 A1 | 4/2009 |
| WO | 2009/151107 A1 | 12/2009 |
| WO | 2010/140333 A1 | 12/2010 |
| WO | 2011-158510 A | 12/2011 |
| WO | 2012/091179 A | 7/2012 |
| WO | 2013-146612 A | 3/2013 |

OTHER PUBLICATIONS

Material Safety Data Sheet Molybdenum(iv) sulfide, created Sep. 9, 1998, pp. 1-5.

Molysulfide Product Data Sheet, Climax Molybdenum, 2015, pp. 1-2.

* cited by examiner

[FIG. 1]
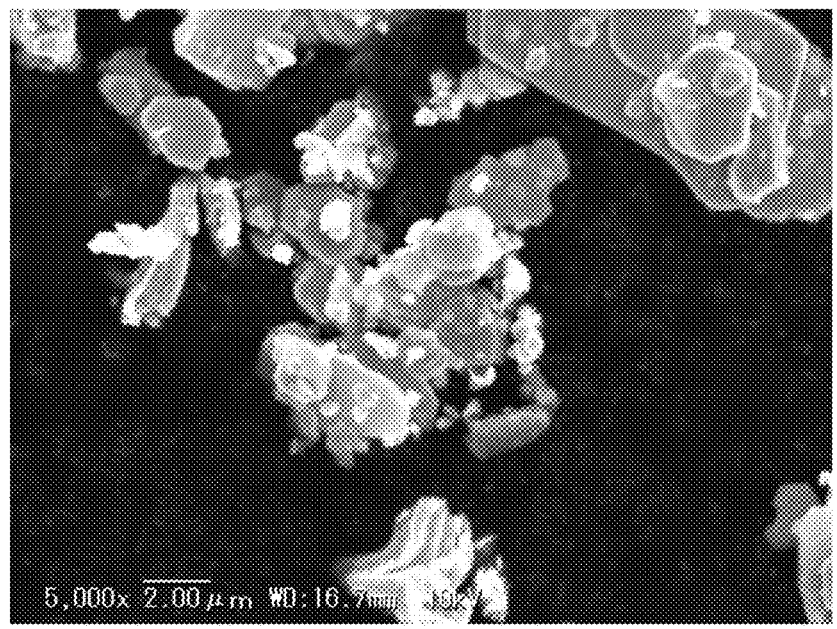
[FIG. 2]
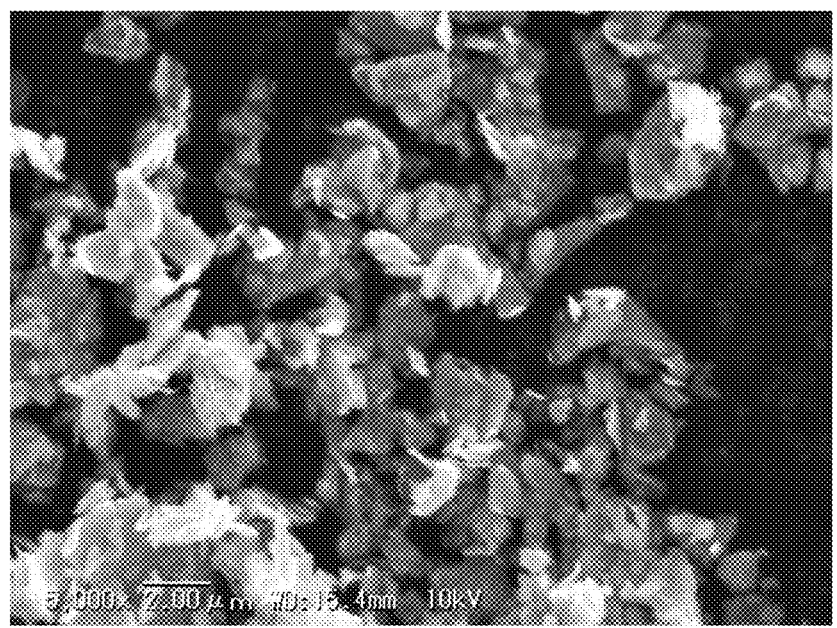

[FIG. 3]
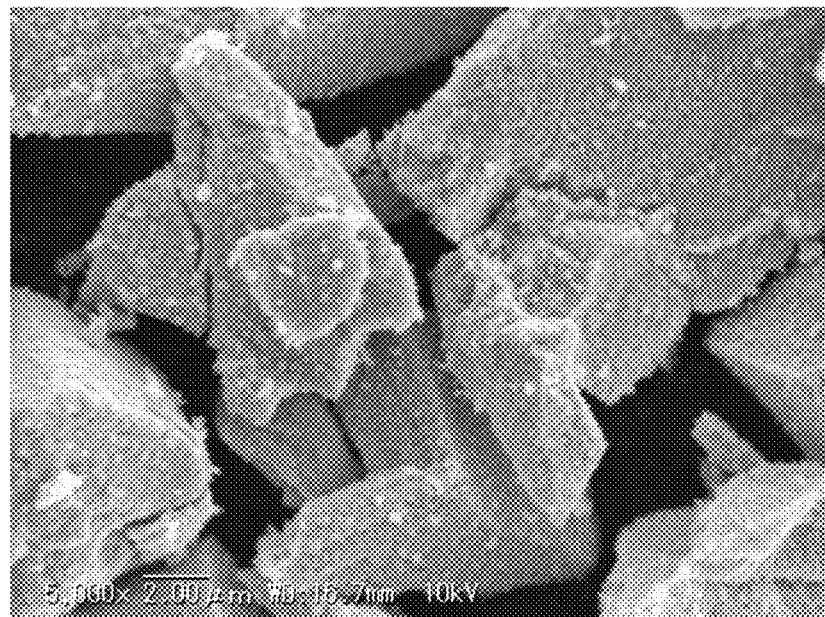
[FIG. 4]
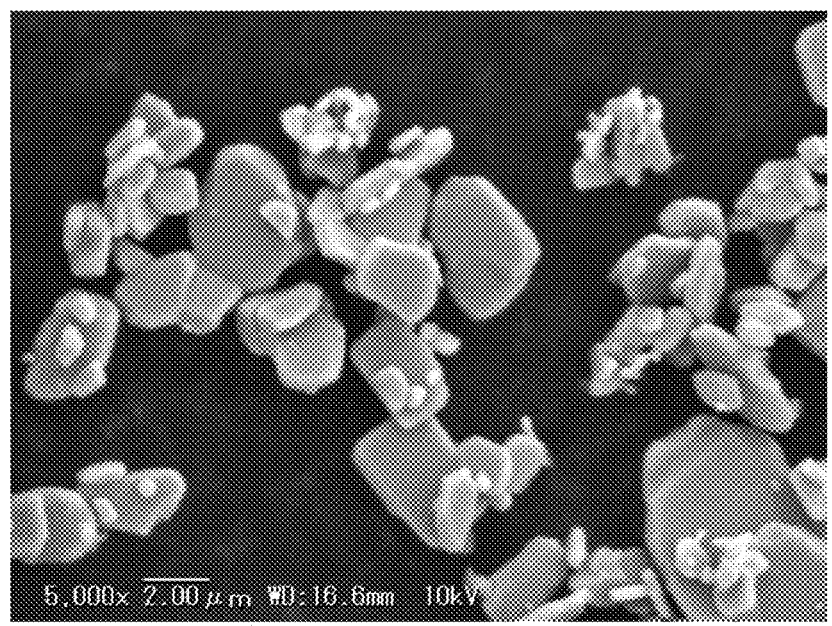

[FIG. 7]
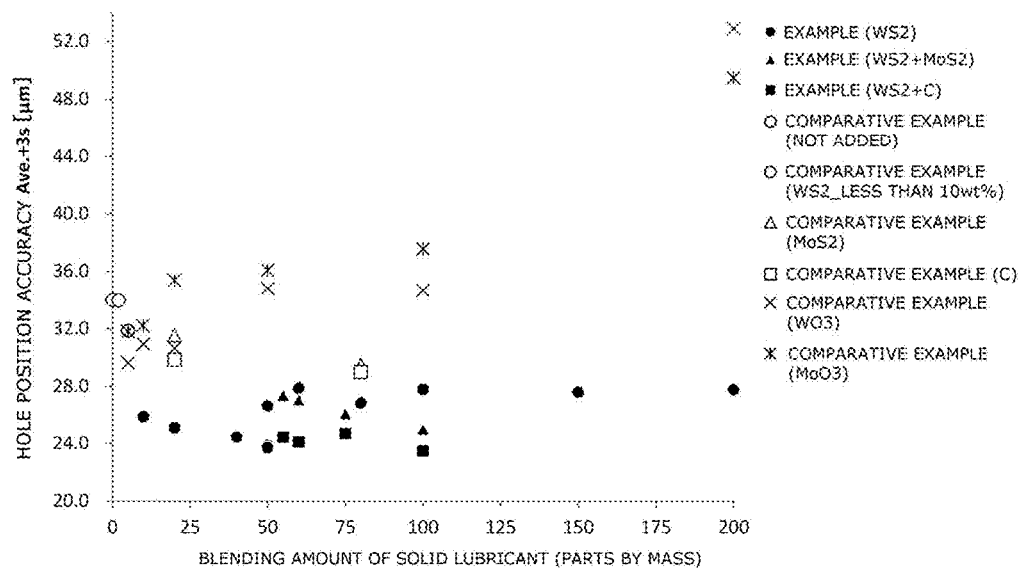
[FIG. 8]
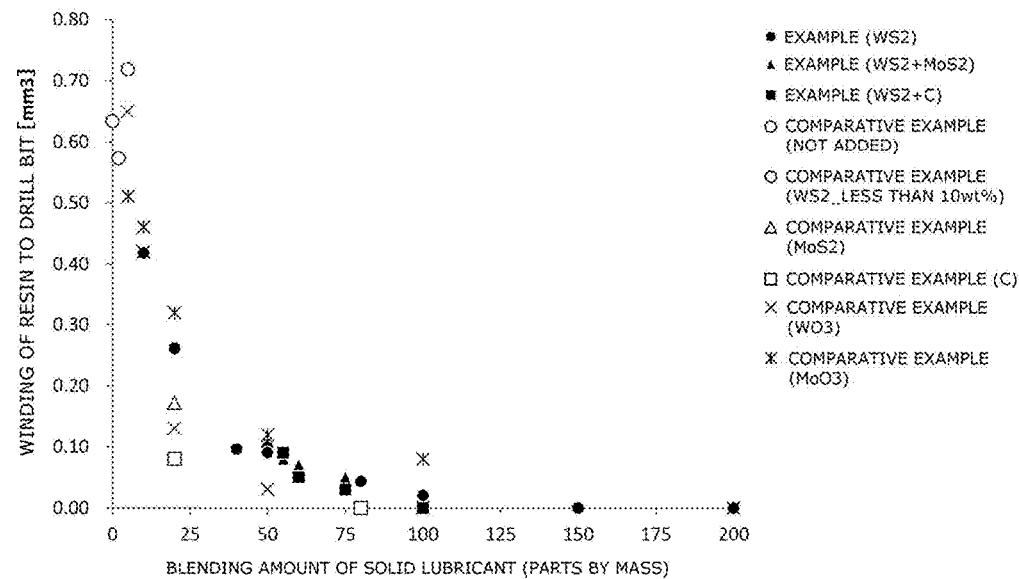

[FIG. 9]
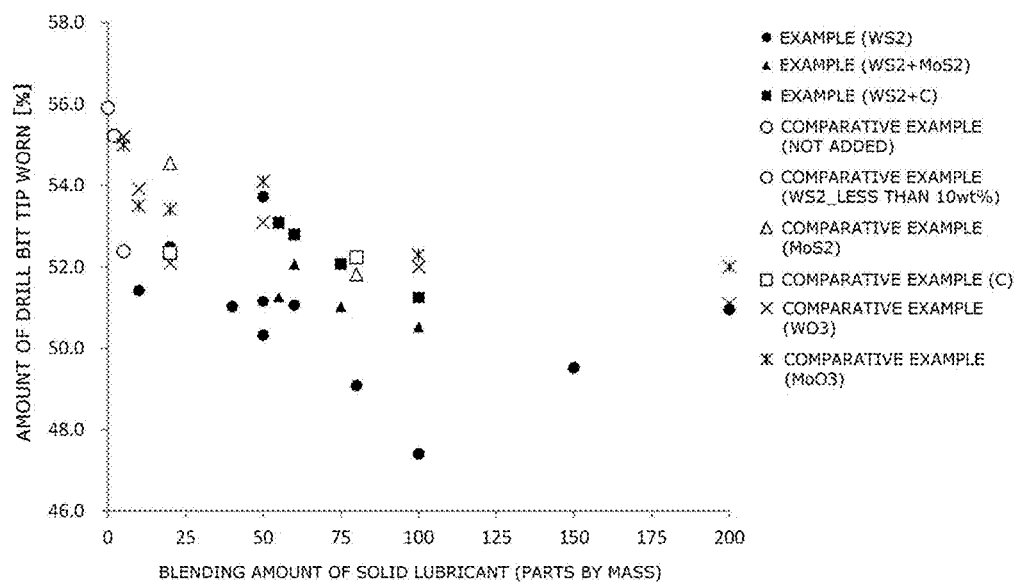
[FIG. 10]
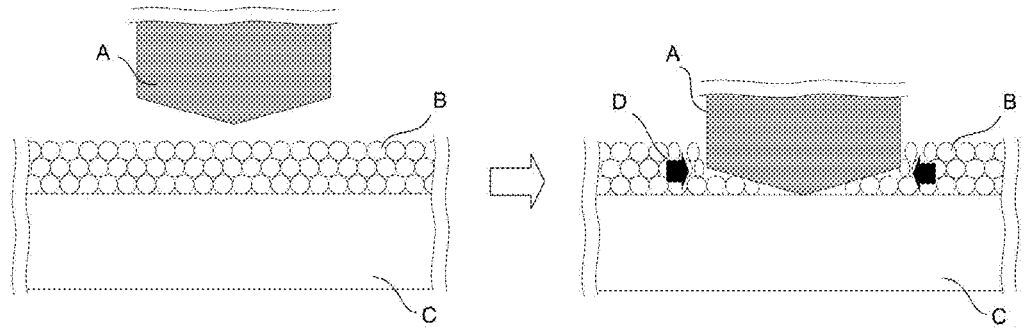

[FIG. 11]
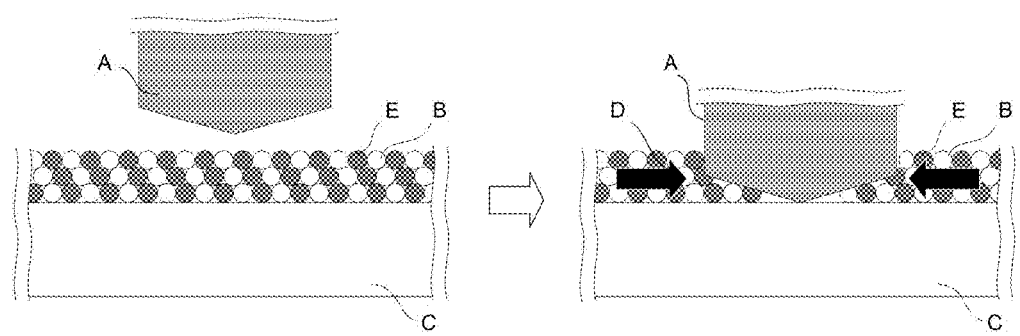

ENTRY SHEET FOR DRILLING

CROSS-REFERENCE TO RELATED APPLICATIONS

This application is a U.S. national phase application filed under 35 U.S.C. § 371 of International Application PCT/JP2015/059950, filed on Mar. 30, 2015, designating the United States, which claims priority from Japanese Application No. 2014-072337, filed Mar. 31, 2014, which are hereby incorporated herein by reference in their entirety.

FILED OF THE INVENTION

The present invention relates to an entry sheet for drilling.

BACKGROUND OF THE INVENTION

In a generally adopted method of drilling processing of a laminate or a multilayer board for use as a printed wiring board material, one laminate or multilayer board or a plurality of laminates or multilayer boards stacked are provided, and on the uppermost surface thereof, a sheet as an entry board is stacked which is a metal foil of aluminum or the like alone or includes such a metal foil and a resin composition layer formed thereon (hereinafter, such a sheet is usually referred to as "entry sheet for drilling", or also simply referred to as "entry sheet"), followed by performing hole boring processing. A "copper-clad laminate" is generally used as the laminate in many cases, but a "laminate" with no copper foil on the outer layer thereof may also be used.

In recent years, progress of high density, enhancement in productivity and cost reduction, as well as enhancement in reliability has been demanded of a laminate or a multilayer board as a printed wiring board material, and there has also been demanded hole boring processing of high quality such as enhancement in hole position accuracy. In response to such demands, for example, Patent Document 1 has proposed a method of hole boring processing, in which a sheet including a water-soluble resin such as polyethylene glycol is used. In addition, Patent Document 2 has proposed a lubricant sheet for hole boring, in which a water-soluble resin layer is formed on a metal foil. Furthermore, Patent Document 3 has proposed an entry sheet for hole boring, in which a water-soluble resin layer is formed on an aluminum foil with a thermosetting resin thin film formed thereon.

Moreover, an entry sheet for hole boring in which a solid lubricant is used has also been proposed. For example, Patent Document 4 has proposed an auxiliary plate material for hole boring, in which the auxiliary plate material includes a lubricant layer, a composite material including a nanostructured powder (of tungsten disulfide or the like) and a solid, wear-resistant lubricant layer that is a highly thermal conductive compound, and a supporting agent. Patent Document 5 has proposed an entry sheet for hole boring which has a water-soluble resin layer containing zinc molybdate and molybdenum trioxide.

CITATION LIST

Patent Documents

Patent Document 1: Japanese Patent Laid-Open No. 4-92494
Patent Document 2: Japanese Patent Laid-Open No. 5-169400
Patent Document 3: Japanese Patent Laid-Open No. 2003-136485
Patent Document 4: Japanese Patent Laid-Open No. 2007-281404
Patent Document 5: International Publication No. WO2012/091179

SUMMARY OF INVENTION

Meanwhile, the printed wiring board technique more slowly progresses than the semiconductor technique, and is detached from the semiconductor technique. Therefore, there has been an increasingly highly demand for progress of high density and enhancement in reliability on a printed wiring board. For example, the minimum drill bit diameter in mass production is shifting from 0.2 mmφ, through 0.18 mmφ and 0.15 mmφ, to 0.105 mmφ. In addition, drilling of 0.08 mmφ, 0.075 mmφ, and 0.05 mmφ is attempted in some cases as competition with the laser-boring technique. Furthermore, demands for enhancement in productivity and cost reduction know no limits, due to competition by globalization and capturing of demands in emerging countries. Accordingly, development of a novel entry sheet for drilling in response to such demands is much needed.

In processing by use of a conventional entry sheet for drilling, the heat of friction between a drill bit and a laminate or a multilayer board melts a resin composition including a water-soluble resin and the like around the drill bit to thereby allow lubricity to be exhibited. As a side effect thereof, however, the resin composition is molten or thermally deformed to thereby cause the drill bit to be easily side slipped. Specifically, the tip of the drill bit proceeds into a layer including the resin composition and searches a biting point while being side slipped, and if the resin composition around the drill bit is here soft, a centripetal force acting on the drill bit becomes weak to cause side slipping of the drill bit to be hardly stopped. Therefore, in processing by use of a conventional entry sheet for drilling processing, there is a limit to enhancement in hole position accuracy. Herein, the "centripetal force" means an external stress that enhances centrality of the drill bit, and examples of the centripetal force include a stress that acts against the rotation center in rotation of the drill bit.

In view of such circumstances, an object of the present invention is to provide an entry sheet for drilling which is excellent in hole position accuracy and enables to reduce drill bit breakage as compared with a conventional entry sheet for drilling.

The present inventors have made various studies in order to solve the above problems, and as a result, have found that when tungsten disulfide is blended as a solid lubricant in an amount within a specific range to a resin composition included an entry sheet for drilling, centrality of a drill bit is enhanced to thereby enhance hole position accuracy. The present inventors have further found that the lubrication action of the tungsten disulfide can increase lubricity to smoothly discharge a chip to thereby prevent the chip from being formed into a lump and prevent drill bit breakage due to contact of a lump-like chip with a drill bit, and also found that the lubrication action of the tungsten disulfide results in enhancement in the life of the drill bit. Thus, the present inventors have completed the present invention. Herein, the "centrality" refers to the ability to advance directly in the machining direction of the drill bit during machining. For example, at the point where the drill bit is in contact with a layer including the resin composition (hereinafter, also referred to as "resin composition layer".) provided in the entry sheet for drilling, the cutting blade at the tip of the rotating drill bit bites the surface of the resin composition layer while slipping around. Here, an entry sheet whose lubricity is merely increased causes the cutting blade at the tip of the drill bit to be easily side slipped, thereby resulting in loss of centrality and deterioration in hole position accuracy.

That is, the present invention is as follows.

(1) An entry sheet for drilling, comprising a metal foil, and a layer including a resin composition and formed on at least one surface of the metal foil, wherein
the resin composition includes a resin and tungsten disulfide as a solid lubricant, and
a content of the tungsten disulfide included in the resin composition is 10 parts by mass to 200 parts by mass based on 100 parts by mass of the resin included in the resin composition.

(2) The entry sheet for drilling according to (1), wherein the resin composition further includes a solid lubricant that is different from the tungsten disulfide.

(3) The entry sheet for drilling according to (2), wherein the resin composition includes graphite as the solid lubricant that is different from the tungsten disulfide.

(4) The entry sheet for drilling according to any one of (1) to (3), wherein a particle diameter at a maximum peak in a particle size distribution curve of the tungsten disulfide, measured with a laser diffraction particle size distribution measurement apparatus, is 1 to 20 μm.

(5) The entry sheet for drilling according to any one of (1) to (4), wherein the layer including the resin composition has a thickness in the range from 0.02 to 0.3 mm.

(6) The entry sheet for drilling according to any one of (1) to (5), wherein the resin composition includes a water-soluble resin (A).

(7) The entry sheet for drilling according to (6), wherein the water-soluble resin (A) is one or more selected from the group consisting of polyethylene oxide, polypropylene oxide, sodium polyacrylate, polyacrylic amide, polyvinylpyrrolidone, a cellulose derivative, polytetramethylene glycol, a polyester of polyalkylene glycol, polyethylene glycol, polypropylene glycol, monoethers of polyoxyethylene, polyoxyethylene monostearate, polyoxyethylene sorbitan monostearate, polyglycerol monostearates, and a polyoxyethylene-propylene copolymer.

(8) The entry sheet for drilling according to any one of (1) to (7), wherein the resin composition includes a thermoplastic water-insoluble resin.

(9) The entry sheet for drilling according to (8), wherein the thermoplastic water-insoluble resin is one or more selected from the group consisting of an amide-based elastomer, a butadiene-based elastomer, an ester-based elastomer, an olefin-based elastomer, a urethane-based elastomer, a styrene-based elastomer, polybutene, low density polyethylene, chlorinated polyethylene, a metallocene-based polyolefin resin, an ethylene/acrylic acid ester/maleic anhydride copolymer, an ethylene/glycidyl (meth)acrylate copolymer, an ethylene/vinyl acetate copolymerization resin, a modified-ethylene/vinyl acetate copolymerization resin, an ethylene/(meth)acrylic acid copolymerization resin, an ionomer resin, and an ethylene/(meth)acrylic acid ester copolymerization resin.

(10) The entry sheet for drilling according to any one of (1) to (9), wherein the resin composition includes a water-insoluble lubricant that is not a solid lubricant.

(11) The entry sheet for drilling according to (10), wherein the water-insoluble lubricant that is not a solid lubricant is one or more selected from the group consisting of an amide-based compound, a fatty acid-based compound, a fatty acid ester-based compound, an aliphatic hydrocarbon-based compound and a higher aliphatic alcohol.

(12) The entry sheet for drilling according to any one of (1) to (11), wherein the metal foil has a thickness in the range from 0.05 to 0.5 mm.

(13) The entry sheet for drilling according to any one of (1) to (12), comprising an adhesion layer in a form of a resin film between the metal foil and the layer including the resin composition, and the resin film has a thickness in the range from 0.002 to 0.02 mm.

(14) The entry sheet for drilling according to claim 13, wherein the resin film includes 1 part by mass to 50 parts by mass of tungsten disulfide as a solid lubricant based on 100 parts by mass of the resin included in the resin film.

(15) The entry sheet for drilling according to any one of (1) to (14), for use in hole boring processing by a drill bit having a diameter of 0.30 mmφ or less.

(16) The entry sheet for drilling according to any one of (1) to (15), for use in drilling processing of a laminated or a multilayer board.

When using the entry sheet for drilling of the present invention, an excellent lubricity of the resin composition layer including tungsten disulfide can bring about an excellent hole position accuracy in hole boring processing and a decrease in drill bit breakage in hole boring processing. As a result, a higher density design can be achieved, and high-quality hole boring processing excellent in productivity can also be achieved. Further, the life of a drill bit can be extended, and also the number of sheets stacked and subjected to hole boring processing at once, can be increased to thereby afford enhancement in productivity and cost reduction.

BRIEF DESCRIPTION OF DRAWINGS

FIG. 1 is a scanning electron micrograph (×5,000) illustrating one example of tungsten disulfide.

FIG. 2 is a scanning electron micrograph (×5,000) illustrating one example of molybdenum disulfide.

FIG. 3 is a scanning electron micrograph (×5,000) illustrating one example of tungsten trioxide.

FIG. 4 is a scanning electron micrograph (×5,000) illustrating one example of molybdenum trioxide.

FIG. 5 is a graph for comparison of hole position accuracy between Examples and Comparative Examples (at 1500 hits).

FIG. 6 is a graph for comparison of hole position accuracy between Examples and Comparative Examples (at 3000 hits).

FIG. 7 is a graph for comparison of hole position accuracy between Examples and Comparative Examples (at 6000 hits).

FIG. 8 is a graph for comparison of the amount of an entangled resin around a drill bit between Examples and Comparative Examples (at 6000 hits).

FIG. 9 is a graph for comparison of the amount of wear at a drill bit tip between Examples and Comparative Examples (at 6000 hits).

FIG. 10 is a schematic view for illustrating the centripetal force of a drill bit.

FIG. 11 is a schematic view for illustrating the centripetal force of a drill bit.

DESCRIPTION OF EMBODIMENTS

Hereinafter, an embodiment for carrying out the present invention (hereinafter, simply referred to as "the present embodiment".) will be described, if necessary, with reference to the drawings, but the present invention is not limited to the following present embodiment. The present invention can be variously modified without departing the scope thereof. Herein, the same element is represented by the same reference sign in the drawings, and redundant description is omitted. In addition, the positional relationships of the top and bottom, the left and right, and the like are based on the positional relationship illustrated in the drawings, unless otherwise noted. Furthermore, the dimension ratio in the drawings is not limited to the ratio illustrated in the drawings. Herein, the "(meth)acrylic" means "acrylic" and "methacrylic" corresponding thereto, and the "(meth)acrylate" means "acrylate" and "methacrylate" corresponding thereto.

An entry sheet for drilling of the present embodiment (hereinafter, also simply referred to as "entry sheet".) includes a metal foil, and a layer including a resin composition (hereinafter, also referred to as "resin composition layer".) and formed on at least one surface of the metal foil. In the entry sheet of the present embodiment, the resin composition includes a resin and tungsten disulfide as a solid lubricant, and the content of the tungsten disulfide included in the resin composition is 10 parts by mass to 200 parts by mass based on 100 parts by mass of the resin in the resin composition.

First, elements forming the entry sheet for drilling of the present embodiment will be described. In the present embodiment, the solid lubricant is a solid that is used in the form of a thin film or a powder in order to decrease the drill bit-wearing speed and reduce heat generation due to friction in hole boring processing. The solid lubricant preferably has a melting point of 300° C. or higher, and if so, it can be thermally stable and be hardly molten to keep in the solid state even in air at a temperature (for example, 200° C.) that is higher than the use temperature of the entry sheet in hole boring processing. Herein, the temperature of the entry sheet when used in hole boring processing varies depending on a subject to be processed, and is preferably 100° C. or higher and less than 200° C.

In the present embodiment, the resin composition essentially includes tungsten disulfide as the solid lubricant. Tungsten disulfide is a soft mineral next to talc having a Mohs hardness of 1 to 1.5, and is a solid lubricant that is not molten even at a high temperature and that is stable to 450° C. in the atmosphere. Tungsten disulfide is higher in oxidation temperature by about 100° C. than molybdenum disulfide that can be similarly used as the solid lubricant and thus has higher heat resistance and pressure resistance. In addition, tungsten disulfide is also low in friction coefficient ($\mu$), and is characterized by a stable friction coefficient without being affected by the humidity, in particular, in the temperature region of 100° C. or higher and less than 200° C. Furthermore, tungsten disulfide is low in aggregation property when dispersed in the resin composition, and has better dispersibility in the resin composition than that of molybdenum disulfide.

In general, tungsten disulfide includes, as impurities, sulfur and metal tungsten that are unreacted substances in production. In the present embodiment, the tungsten disulfide preferably has a purity of 85% by mass or more, more preferably 90% by mass or more, particularly preferably 95% by mass or more. Herein, the upper limit of the tungsten disulfide purity is not particularly limited, and may be 100% by mass or 99% by mass. When the tungsten disulfide has a purity of 85% by mass or more, it can more effectively exhibit performance as the solid lubricant. Examples of a commercially available product of such tungsten disulfide include Tungmic A, B (trade name) produced by Japanese Lubricant Ltd. The tungsten disulfide purity is measured according to a subtracting method. That is, the numerical value obtained by subtracting the mass of impurities included in tungsten disulfide, such as sulfur and metal tungsten, from the total mass is defined as the tungsten disulfide purity. Herein, examples of other method for measuring tungsten disulfide purity include ICP (Inductively Coupled Plasma) mass spectrometry.

The resin composition according to the present embodiment includes 10 parts by mass to 200 parts by mass of the tungsten disulfide based on 100 parts by mass of the resin included in the resin composition. The content of the tungsten disulfide is preferably 10 parts by mass to 150 parts by mass, more preferably 10 parts by mass to 100 parts by mass, based on 100 parts by mass of the resin. When the content of the tungsten disulfide is 10 parts by mass or more, the lubrication effect and the effect of enhancing centrality of a drill bit can be more efficiently and certainly exerted. In addition, when the content of the tungsten disulfide is 200 parts by mass or less, aggregation of the tungsten disulfide in the resin composition can be suppressed to result in enhancement in centrality of a drill bit to thereby achieve excellent hole position accuracy, and also there is an advantage in economic rationality.

In the present embodiment, the tungsten disulfide is preferably present in the state of being dispersed in the resin composition. The average particle diameter of the tungsten disulfide in the resin composition is preferably 1 $\mu$m to 20 $\mu$m, more preferably 1 $\mu$m to 15 $\mu$m, further preferably 1 $\mu$m to 10 $\mu$m, particularly preferably 3 $\mu$m to 8 $\mu$m. Tungsten disulfide having an average particle diameter of 1 $\mu$m to 20 $\mu$m is a solid having a proper volume and a proper hardness, and therefore can further sufficiently exhibit a feature as a lubricant, namely, a layered structure. When the average particle diameter is 1 $\mu$m or more, the feature as a lubricant, namely, a layered structure can be more sufficiently exhibited, and such a case is thus preferable. In addition, when the average particle diameter is 20 $\mu$m or less, hole position accuracy can be further increased and also a chip can be more favorably discharged.

The average particle diameter of the tungsten disulfide in the present embodiment is measured as follows. The soluble fraction included in the resin composition forming the entry sheet for drilling of the present embodiment is dissolved in warm water and/or a solvent at 60° C. or higher. Next, the resulting solution of the resin composition is filtered and washed, and a liquid component is sufficiently evaporated and removed to collect a solid included in the resin composition. The resulting solid is dispersed in a solution including a 0.2% hexametaphosphoric acid solution and several droplets of 10% triton, and the maximum length of each tungsten disulfide particle projected is measured with a laser diffraction particle size distribution measurement apparatus (model number: SALD-2100, manufactured by Shimadzu Corporation). Next, the particle size distribution curve (based on the number of particles) is created from the measurement results. The range from the minimum value (minimum particle diameter) to the maximum value (maximum particle diameter) shown in the curve is defined as the range of the particle diameter of the tungsten disulfide, and the particle diameter at the maximum peak in the particle size distribution curve (the particle diameter at which the tungsten disulfide is most present based on the number of particles) is defined as the average particle diameter.

Herein, the average particle diameter is more important than the maximum particle diameter, with respect to the particle diameter of the tungsten disulfide. The reason is because the particle diameter of the tungsten disulfide included in the resin composition in a high content has greater influences on hole position accuracy and lubricity that are characteristics of the entry sheet for drilling. Therefore, it is important for enhancement in performance of the entry sheet for drilling of the present embodiment to manage the average particle diameter of the tungsten disulfide.

As described above, the entry sheet for drilling of the present embodiment includes a layer including the resin composition that contains the tungsten disulfide as the solid lubricant, in which the content of the tungsten disulfide in the resin composition is in the specific range, and therefore the entry sheet is excellent in hole position accuracy as compared with a conventional entry sheet for drilling. Additionally, the entry sheet for drilling of the present embodiment is also excellent in suppression of drill bit breakage and in life of a drill bit.

FIGS. 10 and 11 are views schematically illustrating a state where a drill bit proceeds into the entry sheet in drilling, and a water-soluble resin (A) in the form of a crystal designated as symbol B is used as the resin. FIG. 10 illustrates a case where the resin composition includes no solid lubricant and FIG. 11 illustrates a case where the resin composition includes tungsten disulfide as a solid lubricant. When the resin composition is one including the water-soluble resin (A) B but including no solid lubricant, as illustrated in FIG. 10, the tip of a drill bit A searches a biting point while proceeding into the resin composition layer and side slipping therein. The resin composition around the drill bit A is soft, and therefore a centripetal force D acting on the drill bit A is weaker to hardly stop side slipping of the drill bit A. Therefore, there is a limit on enhancement in hole position accuracy. The present inventors then have found that tungsten disulfide is blended as a solid lubricant and that the amount thereof to be blended is optimized.

Hereinafter, main functions and effects of the entry sheet for drilling of the present embodiment will be described, but the functions and effects of the entry sheet are not limited to the following.

Primarily, tungsten disulfide has a proper hardness. It is then a voluminous solid lubricant, namely, is maintained in the solid state where the shape thereof is secured, even at a use temperature in drilling processing, and the position thereof is also easily secured. As a result, in hole boring processing by use of the entry sheet for drilling processing of the present embodiment, when a resin composition including the water-soluble resin (A) B includes tungsten disulfide E as a solid lubricant, as illustrated in FIG. 11, the tip of the drill bit A proceeding into the resin composition layer bites the tungsten disulfide E that is a solid lubricant whose shape and position are secured. Thus, centrality is improved to increase the centripetal force D, and the hole position accuracy, in particular at cumulative 3,000 hits from the initial stage, is excellent as compared with that in hole boring processing by use of a conventional entry sheet for drilling.

Secondly, the tungsten disulfide E suppresses thermal deformation of the resin composition and side slipping of the drill bit A. Thus, the drill bit A can achieve a sufficient centripetal force D, and is excellent in hole position accuracy even at cumulative 6,000 hits where wearing of the drill bit progresses.

Thirdly, the tungsten disulfide E is attached to a groove of the drill bit A, and the lubrication action thereof can smoothly discharge a chip. As a result, a chip generated by hole boring processing can be inhibited from being formed into a lump to thereby prevent drill bit breakage due to contact of the drill bit A with a lump-like chip.

Fourthly, the tungsten disulfide E is attached to the surface and the groove of the drill bit A, as well as a hole wall of a subject to be bored (for example, a printed wiring board material such as a laminate or a multilayer board), and is present all the time between the subject to be bored and the drill bit A to enhance lubricity. As a result, when the entry sheet of the present embodiment is used, wearing of the drill bit A is suppressed and an excellent life of a drill bit is achieved.

The functions and effects of the entry sheet by use of the above tungsten disulfide are excellent as compared to those of an entry sheet using molybdenum disulfide, zinc molybdate or molybdenum trioxide in a conventional art. As a result, the entry sheet for drilling by use of the tungsten disulfide as a solid lubricant, of the present embodiment, is remarkably excellent in hole position accuracy and life of a drill bit as compared to a conventional entry sheet for drilling by use of molybdenum disulfide, zinc molybdate or molybdenum trioxide as a solid lubricant.

Furthermore, the tungsten disulfide is non-swellable. Therefore, it is not required to be critically managed with respect to the degree of moisture retention like a swellable solid lubricant such as synthetic mica or clay, which is industrially convenient. The definition of non-swellability will be here described. A aqueous solution in which a 10 parts by mass of a solid lubricant is blended in 90 parts by mass of water is received in a vessel having a certain inner diameter in the height direction and having a flat inner bottom surface, such as a beaker or a flask, and is stirred until sufficient mixing is achieved. Thereafter, the solution is left to stand for 1 hour, the settling height of the solid lubricant is then measured, and a case where the settling height ratio (the ratio of the height from the inner bottom surface of the vessel to the upper surface of the solid lubricant settled to the height from the inner bottom surface of the vessel to the liquid level of the aqueous solution) is less than 50% is defined as non-swelling. Herein, a case where the settling height ratio is 90% or more is defined as dispersing or swelling, and a case where the settling height ratio is 50% or more and less than 90% is defined as swelling. In an example of the tungsten disulfide for use in the present embodiment, the height from the inner bottom surface to the liquid level is 60 mm, the height from the inner bottom surface to the upper surface of the tungsten disulfide settled is 22 mm, the settling height ratio is 36.7%, and clear separation to two layers is observed.

Such characteristics serve as the following advantages: when the tungsten disulfide is dispersed in a solution of a resin composition described later, it is easily uniformly dispersed and hardly aggregated. As a result, the tungsten disulfide can be favorably dispersed also in the entire entry sheet to be obtained. In addition, the tungsten disulfide hardly remains in a hole in washing after hole boring processing. The tungsten disulfide, however, is preferably subjected to sufficient stirring so as not to generate the concentration gradient of the tungsten disulfide when dispersed in the solution of the resin composition.

The resin included in the resin composition in the present embodiment is preferably a water-soluble resin (A). The water-soluble resin (A) encompasses not only a water-soluble resin described below but also a water-soluble lubricant that is not a solid lubricant. Herein, the lubricant "that is not a solid lubricant" encompasses a liquid lubricant and a semi-solid lubricant.

The water-soluble resin is not particularly limited, and for example, is preferably one or more selected from the group consisting of polyethylene oxide; polypropylene oxide; sodium polyacrylate; polyacrylic amide; polyvinylpyrrolidone; a cellulose derivative; polytetramethylene glycol; and a polyester of polyalkylene glycol. The polyester of polyalkylene glycol refers to a condensate obtained by reacting a polyalkylene glycol with a dibasic acid. Examples of the polyalkylene glycol can include polyethylene glycol, polypropylene glycol and polytetramethylene glycol, and glycols exemplified by copolymerized products thereof. Examples of the dibasic acid include partial esters of polyvalent carboxylic acids such as phthalic acid, isophthalic acid, terephthalic acid, sebacic acid and pyromellitic acid, and acid anhydrides thereof. These are used singly or in combinations of two or more.

The kind of the water-soluble lubricant that is not a solid lubricant is not particularly limited, and examples thereof include polyethylene glycol, polypropylene glycol; monoethers of polyoxyethylenes, exemplified by polyoxyethylene oleyl ether, polyoxyethylene cetyl ether, polyoxyethylene stearyl ether, polyoxyethylene lauryl ether, polyoxyethylene nonyl phenyl ether and polyoxyethylene octyl phenyl ether; polyoxyethylene monostearate; polyoxyethylene sorbitan monostearate; polyglycerol monostearates exemplified by hexaglycerol monostearate and decaglycerol monostearate; and a polyoxyethylene-propylene copolymer. These can be used singly or as an appropriate mixture of two or more.

Among them, the water-soluble resin is preferably polyethylene oxide and the water-soluble lubricant that is not a solid lubricant is preferably polyethylene glycol, from the viewpoint of more effectively and certainly achieving the object of the present invention.

The resin composition preferably includes a thermoplastic water-insoluble resin. The resin composition includes a thermoplastic water-insoluble resin to thereby allow the resin composition layer to be hard and allow the position of the tungsten disulfide in the resin composition layer to be further easily retained. As a result, the effect of enhancement in hole position accuracy due to enhancement in centrality and the effect of enhancement in lubricity, which are the effects of the present invention, are more effectively and certainly exerted.

A resin other than the water-soluble resin (A) includes the thermoplastic water-insoluble resin as described above, the kind thereof is not particularly limited, and a known resin can be used therefor. Examples of the thermoplastic water-insoluble resin include an amide-based elastomer, a butadiene-based elastomer, an ester-based elastomer, an olefin-based elastomer, a urethane-based elastomer, a styrene-based elastomer, polybutene, a low density polyethylene, a chlorinated polyethylene, a metallocene-based polyolefin resin, an ethylene/acrylic acid ester/maleic anhydride copolymer, an ethylene/glycidyl (meth)acrylate copolymer, an ethylene/vinyl acetate copolymerization resin, a modified-ethylene/vinyl acetate copolymerization resin, an ethylene/(meth)acrylic acid copolymerization resin, an ionomer resin, and an ethylene/(meth)acrylic acid ester copolymerization resin. The thermoplastic water-insoluble resin is used singly or in combinations of two or more, and may be used in combination with the water-soluble resin (A).

Herein, the "water-insoluble" means that the solubility in water at room temperature is 10 mg/dm$^3$ or less. In other words, the "water-soluble" herein means that the solubility in water at room temperature is more than 10 mg/dm$^3$.

The resin composition in the present embodiment is not particularly limited provided that it includes the resin and a predetermined amount of the tungsten disulfide, and may include at least one selected from a solid lubricant different from the tungsten disulfide and a water-insoluble lubricant that is not a solid lubricant.

The resin composition in the present embodiment contains the tungsten disulfide as a solid lubricant, but preferably also include a solid lubricant other than the tungsten disulfide from the viewpoints of hole position accuracy (in particular, hole position accuracy at a high number of hits), suppression of winding of the resin to a drill bit, and reduction in wearing of a drill bit tip. Examples of the solid lubricant other than the tungsten disulfide include graphite, molybdenum disulfide and molybdenum trioxide. Graphite and molybdenum disulfide are preferable and graphite is more preferable from the same viewpoints as described above. Graphite having a purity of 95% or more or having a particle diameter of 30 μm or less is further preferable. These are used singly or in combinations of two or more.

When the resin composition includes the tungsten disulfide and the solid lubricant other than the tungsten disulfide, the content ratio of the tungsten disulfide to the solid lubricant other than the tungsten disulfide (tungsten disulfide:solid lubricant other than tungsten disulfide) is preferably 10:90 to 90:10, more preferably 20:80 to 80:20 on a mass ratio. When the content ratio is within the above range, the hole position accuracy (in particular, hole position accuracy at a high number of hits) becomes more excellent and further winding of the resin to a drill bit can be suppressed to more reduce wearing of a drill bit tip.

The kind of the water-insoluble lubricant that is not a solid lubricant is also not particularly limited, and a known substance can be used. Examples of such a water-insoluble lubricant include amide-based compounds exemplified by ethylene bis stearamide, oleic amide, stearic amide and methylene bis stearamide, fatty acid-based compounds exemplified by lauric acid, stearic acid, palmitic acid and oleic acid, fatty acid ester-based compounds exemplified by butyl stearate, butyl oleate and glycol laurate, aliphatic hydrocarbon-based compounds exemplified by liquid paraffin and polyethylene wax, and higher aliphatic alcohols exemplified by oleic alcohol. These are used singly or in combinations of two or more. When the resin composition includes the water-insoluble lubricant that is not a solid lubricant, the resin composition layer becomes harder to thereby allow the position of the tungsten disulfide in the resin composition layer to be further easily retained. As a result, the effect of enhancement in hole position accuracy due to enhancement in centrality and the effect of enhancement in lubricity, which are the effects of the present invention, are more effectively and certainly exerted.

The water-soluble resin, the water-soluble lubricant that is not a solid lubricant, the thermoplastic water-insoluble resin, and the water-insoluble lubricant that is not a solid lubricant, which can be included in the above resin composition, play not only the original roles in reducing friction and reducing drill wearing in hole boring processing due to lubricity, but also the role of a carrier that carries the tungsten disulfide to a drill bit and a printed wiring board material.

The thickness of the resin composition layer in the present embodiment is appropriately selected by the diameter of a drill bit for use in drilling processing and the configuration of a subject to be bored (a printed wiring board material such as a laminate or a multilayer board) processed. The thickness of the resin composition layer is preferably in the range from 0.02 to 0.3 mm, more preferably in the range from 0.02 to 0.2 mm. When the thickness of the resin composition layer can be 0.02 mm or more, a higher lubrication effect can be exhibited to decrease the load to a drill bit, resulting in further suppression of drill bit breakage. In addition, the thickness of the resin composition layer can be 0.3 mm or less to result in suppression of winding of the resin composition to a drill bit.

The resin composition in the present embodiment can include, if necessary, additive(s) other than the above as long as the object of the present invention is not inhibited from being achieved. Examples of the additive(s), but the kind(s) thereof being not particularly limited, include a surface conditioner, a leveling agent, an antistatic agent, an emulsifier, a defoamer, a wax additive, a coupling agent, a rheology controlling agent, a preservative agent, an antifungal agent, an antioxidant, a light stabilizer, a nucleating agent, an organic filler, an inorganic filler, a heat stabilizer and a colorant.

The metal foil for use in the entry sheet for drilling of the present embodiment is not particularly limited, and is preferably a metal material that is high in adhesiveness to the resin composition layer and that can withstand impact by a drill bit. Examples of the metal species of the metal foil include aluminum in terms of availability, cost and processability. The material of an aluminum foil is preferably aluminum having a purity of 95% or more, and examples of such an aluminum foil include 5052, 3004, 3003, 1N30, 1N99, 1050, 1070, 1085 and 8021 prescribed in JIS-H4160. An aluminum foil having an aluminum purity of 95% or more can be used for the metal foil to thereby alleviate impact by a drill bit and enhance biting property to the tip portion of a drill bit, resulting in a further increase in hole position accuracy of a processing hole in combination with the lubrication effect of a drill bit by the resin composition.

The thickness of the metal foil is preferably 0.05 to 0.5 mm, more preferably 0.05 to 0.3 mm. When the thickness of the metal foil is 0.05 mm or more, the occurrence of burr on a subject to be bored (for example, a laminate) in drilling processing can be suppressed. In addition, when the thickness of the metal foil is 0.5 mm or less, a chip generated in drilling processing is easily discharged.

A metal foil on whose surface a resin film that functions as an adhesion layer is formed in advance is preferably used in terms of adhesiveness to the resin composition layer. Thus, the entry sheet can have an adhesion layer, which is a resin film, between the metal foil and the resin composition layer. The thickness of the resin film is preferably 0.002 to 0.02 mm, more preferably 0.002 to 0.01 mm in terms of adhesiveness, cost and hole boring property.

The resin for use in the resin film is not particularly limited as long as it can enhance adhesiveness to the resin composition layer, and it may be any of a thermoplastic resin and a thermosetting resin or may be an adhesive resin. Examples of the thermoplastic resin include a urethane-based polymer, a vinyl acetate-based polymer, a vinyl chloride-based polymer, a polyester-based polymer and an acrylic-based polymer, and copolymers thereof. Examples of the thermosetting resin include an epoxy-based resin and a cyanate-based resin. Examples of the adhesive resin include, in addition to the above resins, synthetic resins such as a melamine resin, a urea resin and a phenol resin, and synthetic rubbers such as a chloroprene rubber, a nitrile rubber, a styrene butadiene rubber and a silicone rubber. These are used singly or in combinations of two or more.

In the present embodiment, the resin film can also contain tungsten disulfide as a solid lubricant. When the resin film also contains tungsten disulfide, hole position accuracy can be further enhanced. The content of the tungsten disulfide in the resin film is preferably 1 part by mass to 50 parts by mass, more preferably 5 parts by mass to 30 parts by mass based on 100 parts by mass of the resin in the resin composition forming the resin film. When the content of the tungsten disulfide is 1 part by mass or more, the lubrication effect and centrality of a drill bit are enhanced. In addition, when the content of the tungsten disulfide is less than 50 parts by mass, adhesiveness of the metal foil to the resin composition layer is more sufficient. As the resin of the resin composition forming the resin film to which the tungsten disulfide is added, the thermosetting resin, the thermoplastic resin or the adhesion resin can be used. When the tungsten disulfide as a solid lubricant is added to the resin film, the thickness of the resin film may be appropriately selected depending on the particle diameter of the tungsten disulfide.

The thicknesses of respective layers forming the entry sheet of the present embodiment are measured as follows. First, the entry sheet is cut in the lamination direction of the respective layers by use of a cross-section polisher (manufactured by JEOL Ltd., trade name "CROSS-SECTION POLISHER SM-09010") or an ultramicrotome (manufactured by Leica Camera AG, item number: "EM UC7"). Thereafter, a cross section that appears by cutting is observed in the direction perpendicular to the cross section by use of SEM (Scanning Electron Microscope, manufactured by KEYENCE Corporation, item number: "VE-7800"), and the thicknesses of the respective layers, such as the metal foil, the resin film and the resin composition layer, are measured. The respective thicknesses are measured at 5 points per view of field, and the averages thereof are defined as the thicknesses of the respective layers.

The entry sheet for drilling of the present embodiment is preferably used in drilling processing of a laminate or a multilayer board because the object of the present invention is more effectively and certainly exerted. In addition, such drilling processing can be drilling processing by a drill bit having a diameter (drill bit diameter) of 0.30 mmφ or less, to thereby allow the object of the present invention to be further effectively and certainly exerted. In particular, a small-diameter drill bit application in which the diameter is 0.05 mmφ or more and 0.30 mmφ or less, or furthermore 0.05 mmφ or more and 0.20 mmφ or less where hole position accuracy is important is suitable from the viewpoint of significant enhancements in hole position accuracy and life of a drill bit. Herein, a drill bit diameter of 0.05 mmφ is the lower limit diameter of an available drill bit, and the diameter is not limited to the range mentioned above if a smaller-diameter drill bit would be available. In addition, there is no problem even if the entry sheet of the present embodiment is adopted for drilling processing in which a drill bit having a diameter of more than 0.30 mmφ is used.

Hereinafter, a method for producing the entry sheet for drilling of the present embodiment will be described. The method for producing the entry sheet for drilling of the present embodiment is not particularly limited, and for example, the entry sheet can be produced as follows.

First, a resin composition layer is formed on at least one surface of a metal foil. The method therefor includes a method including directly or indirectly coating the metal foil with a thermally molten product obtained by appropriately melting a resin composition, or a liquid in which the product is dissolved or dispersed in a solvent (hereinafter, simply referred to as "resin composition solution".) by a method such as a coating method, and furthermore drying, and/or cooling and solidifying the resultant. Alternatively, a hot melt method including producing a sheet including a resin composition in advance and bonding the sheet to the metal foil may also be adopted. Here, it is preferable for laminating and integrating the metal foil and the resin composition layer to form a resin film on a surface of the metal foil in advance, the surface corresponding to a surface on which the resin composition layer is to be formed.

When the metal foil is coated with the resin composition solution by a coating method or the like and dried, the resin composition solution is preferably a solution containing a mixed solvent of water and a solvent having a boiling point lower than that of water. The mixed solvent of water and a solvent having a boiling point lower than that of water is used to thereby result in production of a dense spherocrystal and reduction of air bubbles remaining in the resin composition layer. The solvent having a boiling point lower than that of water is not particularly limited in terms of the kind thereof, examples thereof include alcohols such as ethanol, methanol and isopropyl alcohol, and a low boiling point solvent such as methyl ethyl ketone or acetone can also be used therefor. As other solvent, a solvent in which tetrahydrofuran or acetonitrile that is high in compatibility with the resin composition is partially mixed with water or alcohols can be used. When the mixed solvent of water and the solvent having a boiling point lower than that of water is used, the mixing ratio thereof (water/low boiling point solvent) is preferably in the range from 90/10 to 50/50, more preferably in the range from 80/20 to 50/50, further preferably in the range from 70/30 to 50/50, particularly preferably in the range from 60/40 to 50/50 on a mass basis. When the mixing ratio of the solvent having a boiling point lower than that of water is 10 or more, a dense spherocrystal is more easily produced in use of the water-soluble resin (A). The mixing ratio of the solvent having a boiling point lower than that of water can be 50 or less to thereby allow the entry sheet to be industrially and more stably produced.

When the method is adopted which includes coating the metal foil with the resin composition solution or the thermally molten product by a coating method or a hot melt method, and heating and drying, and cooling and solidifying the resultant, the temperature of the entry sheet for drilling in heating and drying is preferably 120° C. to 160° C., the temperature in cooling and solidifying is preferably an ordinary temperature, and cooling to an ordinary temperature (for example, 30° C. or lower) is preferably performed within 5 to 30 seconds. When the temperature in heating and drying is 160° C. or lower, the entry sheet can be industrially and more stably produced. In addition, the cooling temperature can be an ordinary temperature to thereby inhibit dew drops from being generated in a subsequent step.

The method for dispersing the tungsten disulfide as a solid lubricant in the resin composition layer is not particularly limited. For example, the tungsten disulfide can be uniformly dispersed in the resin composition by a high shear force and a high speed rotation by use of a dissolver, a planetary mixer or a butterfly mixer to thereby highly disperse the tungsten disulfide in the resin composition layer that is formed from the resin composition.

The entry sheet for drilling of the present embodiment can be suitably used in drilling processing of, for example, a printed wiring board material, more specifically, a laminate or a multilayer board. Specifically, the entry sheet for drilling is arranged on at least the uppermost surface of a stack (printed wiring board material), where one or more laminates or multilayer boards are stacked, so that the metal foil is in contact with the printed wiring board material, and drilling processing can be performed from the upper surface of the entry sheet (surface of the resin composition layer).

The entry sheet for drilling of the present embodiment can allow drill bit breakage in hole boring processing to be reduced by an excellent hole position accuracy in hole boring processing and an excellent lubricity of the resin composition layer. More particularly, an excellent lubricity of the resin composition layer including the tungsten disulfide can impart an excellent hole position accuracy in hole boring processing and reduce the load to a drill bit in hole boring processing, resulting in reduction of drill bit breakage. As a result, a higher density design is possible and high-reliable (high-quality) hole boring processing excellent in productivity is possible. Alternatively, the life of a drill bit is longer and also the number of sheets stacked, subjected to hole boring processing at once, can be increased to thereby afford enhancement in productivity and cost reduction.

The embodiment for carrying out the present invention is described above, but the present invention is not limited to the above embodiment. The present invention can be variously modified without departing from the scope thereof.

EXAMPLES

Hereinafter, the effect of the present invention will be described with respect to Examples as compared with Comparative Examples which are out of the scope of the present invention, but the present invention is not limited to these Examples. Herein, "tungsten disulfide" may be abbreviated as "WS2", "molybdenum disulfide" may be abbreviated as "MoS2", "graphite" may be abbreviated as "C", "tungsten oxide" may be abbreviated as "WO3", and "molybdenum oxide" may be abbreviated as "MoO3".

Table 1 shows the specifications of raw materials such as resin compositions, solid lubricants and metal foils for use in production of entry sheets for drilling of Examples and Comparative Examples. In addition, Table 2 shows the specifications of drill bits, laminates and entry boards for use in drilling processing of Examples and Comparative Examples.

TABLE 1

| Classification | Symbol | | Trade name | Manufacturer | Note |
|---|---|---|---|---|---|
| Resin composition | A | Polyethylene oxide | Altop MG150 | Meisei Chemical Works Ltd. | 30 parts by mass based on 100 parts by mass of resin composition |
| | | Polyethylene glycol | PEG 20000 | Sanyo Chemical Industries, Ltd. | 70 parts by mass based on 100 parts by mass of resin composition |
| Solid lubricant | B | Not added | — | — | — |
| | C | Tungsten disulfide | — | Japanese Lubricant Ltd. | Average particle diameter 2 μm, Purity 98% |

TABLE 1-continued

| Classification | Symbol | Trade name | Manufacturer | Note |
|---|---|---|---|---|
| | D | Molybdenum disulfide | — | Daizo Corporation | Particle diameter 0.5-29 µm Average particle diameter 5 µm, Purity 98%, Layered structure |
| | E | Graphite | X-10 | Ito Graphite Co., Ltd. | Average particle diameter 10 µm, Purity 98%, Scale-shaped |
| | F | Tungsten trioxide | — | Nippon Tungsten Co., Ltd. | Average particle diameter 12 µm, Purity 99.9% |
| | G | Molybdenum trioxide | — | Nippon Inorganic Colour & Chemical Co., Ltd. | Purity 0.7 µm-55 µm, Average particle diameter 16 µm, Columnar structure |
| Additive | — | Sodium formate | — | Mitsubishi Gas Chemical Company, Inc. | — |
| | — | Surface conditioner | BYK-349 | BYK Japan | — |
| Solvent | — | Ion exchange water | — | — | — |
| | — | Methyl alcohol | — | Mitsubishi Gas Chemical Company, Inc. | — |
| Metal foil | — | High-purity aluminum foil | JIS-A1 N30H18 | Mitsubishi Aluminum Co., Ltd. | 0.10 mmt, Purity: 99.3% |

TABLE 2

| | Condition | Trade name | Manufacturer |
|---|---|---|---|
| Drill bit | 0.2 mmφ | C-CFU020S | Tungaloy Corporation |
| Laminate | Thickness: 0.2 mm, Copper foil thickness: 12 µm, Double-faced plate | HL832 | Mitsubishi Gas Chemical Company, Inc. |
| Backup board | Thickness: 1.5 mm | PS1160G | Risho Kogyo Co., Ltd. |

Example 1

Thirty parts by mass of polyethylene oxide having a weight average molecular weight of 150,000 (produced by Meisei Chemical Works Ltd., trade name: Altop MG-150) and 70 parts by mass of polyethylene glycol having a weight average molecular weight of 20,000 (produced by Sanyo Chemical Industries, Ltd., trade name: PEG20000) were dissolved in a mixed solution of water/MeOH (methanol) so that the resin concentration was 30% by mass, to provide a water-soluble resin solution. The ratio of water to MeOH was here a mass ratio of 60/40. Furthermore, 10 parts by mass of tungsten disulfide (produced by Japanese Lubricant Ltd., average particle diameter: 2 µm, purity: 98%) was added as a solid lubricant to the water-soluble resin solution based on 100 parts by mass of the resin in the water-soluble resin solution, and sufficiently dispersed to provide a resin composition solution. With the resin composition solution was coated a surface of an aluminum foil (item number of aluminum foil used: 1N30, thickness: 0.1 mm, produced by Mitsubishi Aluminum Co., Ltd.) with an epoxy resin film having a thickness of 0.01 mm formed on one surface thereof, where the surface of the aluminum foil corresponded to the resin film surface, by use of a bar coater so that the thickness of a resin composition layer after drying was 0.05 mm, and the resultant was dried by a drier at 120° C. for 5 minutes and thereafter cooled to an ordinary temperature to thereby produce an entry sheet for drilling. Herein, a scanning electron micrograph (magnification: 5000×) of a part of the tungsten disulfide used in the present Example is illustrated in FIG. 1.

Examples 2 to 24

A resin composition solution was prepared according to Example 1 by use of the kind of each material at each rate shown in Table 4, and an entry sheet for drilling, in which the thickness of a resin composition layer after drying was 0.05 mm, was produced. Herein, a scanning electron micrograph (magnification: 5000×) of a part of the molybdenum disulfide used in Examples is illustrated in FIG. 2.

Comparative Examples 1 to 19

A resin composition solution was prepared according to Example 1 by use of the kind of each material at each rate shown in Table 5, and an entry sheet for drilling, in which the thickness of a resin composition layer after drying was 0.05 mm, was produced. Herein, scanning electron micrographs (magnification: 5000×) of parts of the tungsten trioxide and the molybdenum trioxide used in Comparative Examples are illustrated in FIG. 3 and FIG. 4, respectively. The solid lubricant was added per one kind in any amount of 0.0, 2.0, 5.0, 10.0, 20.0, 25.0, 40.0, 50.0, 60.0, 80.0, 100.0, 150.0 and 200.0 parts by mass based on 100 parts by mass of the resin in the resin composition.

Hole boring processing conditions were as follows.

Drill bit diameter: 0.2 mmφ (manufactured by Tungaloy Corporation, trade name: C-CFU020S)

Number of rotations: 200,000 rpm Rate of feed: 13 µm/rev.

Rate of rise: 25.4 m/min

Processing substrate (laminate): item number: HL832, thickness: 0.2 mm, copper foil thickness: 12 µm, 6 sheets stacked <Evaluation Methods>

Comprehensive evaluation was performed according to the evaluation criteria in Table 3, based on the evaluation results of the hole position accuracies at 1 to 1,500 hits, 1 to 3,000 hits and 1 to 6,000 hits, winding of the resin to a drill bit, and wearing of a drill bit tip. The results are shown in each of Tables 4 and 5. Herein, the worst rating among excellent, good, fair and poor rated with respect to each evaluation item was reflected in the comprehensive evaluation.

Each sample of entry sheet for drilling produced in Examples and Comparative Examples was evaluated as follows.

(1) Hole Position Accuracy

Figures 5, 6:
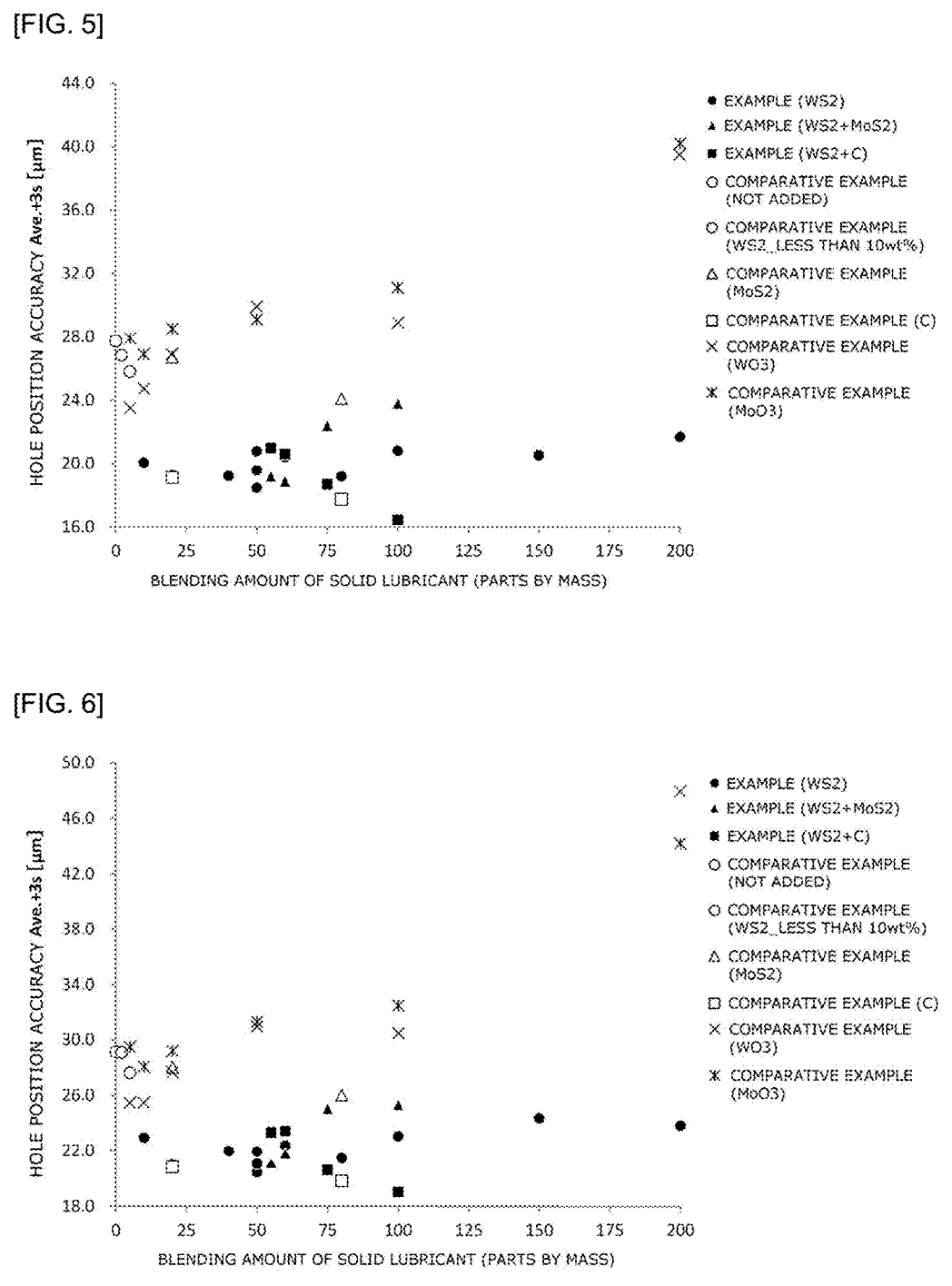

The entry sheet for drilling was arranged on a copper-clad laminate stacked so that the resin composition layer thereof was disposed above, and drilling processing was performed. Hole boring processing of 6,000 hits per one drill bit was performed, and repeated for four drill bits. The displacement between the hole position on the rear surface (lower surface) of the copper-clad laminate stacked undermost and the specified coordinate was measured by use of a hole analyzer (model number: HA-1AM, manufactured by Hitachi Via Mechanics Inc.) with respect to holes at 1 to 1,500 hits, 1 to 3,000 hits and 1 to 6,000 hits per one drill bit. The average and the standard deviation ($\sigma$) were calculated with respect to the displacement, and the "average+3$\sigma$" was calculated. Thereafter, the average with respect to the "average+3$\sigma$" value of each of n drill bits used was calculated as the hole position accuracy in the entire drilling processing. The results are shown in Tables 4 and 5. In addition, graphs for comparison of the hole position accuracy among respective Examples and Comparative Examples are illustrated in FIG. 5 to FIG. 7. Herein, the expression used in calculation of the hole position accuracy is as follows.

$$\text{hole position accuracy in the entire drilling processing } (\mu m) = \left( \sum_{i=1}^{n} \text{"average} + 3\sigma_i'' \text{ of drill bit} \right) \div n$$

(wherein n represents the number of drills used.)

(2) Particle Size of Solid Lubricant

The particle size of the solid lubricant was measured as follows. First, a solid lubricant sample was dispersed in a solution including a 0.2% hexametaphosphoric acid solution and several droplets of 10% triton, and the maximum length of each solid lubricant particle projected was measured by use of a laser diffraction particle size distribution measurement apparatus (model number: SALD-2100, manufactured by Shimadzu Corporation). Next, the particle size distribution curve (based on the number) was created from the measurement results. The range from the maximum particle diameter to the minimum particle diameter shown in the particle size distribution curve was defined as the range of the particle diameter of the solid lubricant. In addition, the particle diameter at the maximum peak in the particle size distribution curve (the particle diameter at which the solid lubricant was most present based on the number of particles) was defined as the average particle diameter.

(3) Amount of Entangled Resin Around Drill Bit

With respect to the drill bit after hole boring processing of 6,000 hits, winding of the resin to the drill bit was observed on the side surface of the drill bit by use of a microscope of 25 times power (model number: VHK-100, manufactured by KEYENCE Corporation). The width and the length of winding of the resin attached to the root of the drill bit were measured, and the amount of the entangled resin around the drill bit was calculated from the following expression. Herein, the units of the length, the width and the diameter were "mm".

Amount of entangled resin around drill bit $(mm^3)=\frac{1}{3}\times$(width of winding of resin/2)$\times$(width of winding of resin/2)$\times$3.14$\times$(length of winding of resin)/2−(diameter of drill bit/2)$\times$(diameter of drill bit/2)$\times$3.14$\times$(length of winding of resin)

The results are shown in Tables 4 and 5. In addition, a graph for comparison of the amount of the entangled resin around the drill bit among respective Examples and Comparative Examples is illustrated in FIG. 8.

(4) Amount of Wear at Drill Bit Tip

The blade edge of the drill bit before hole boring processing was observed at the tip of the drill bit by a V-LASER microscope (model number: VK-9700, manufactured by KEYENCE Corporation) at 200-fold magnification, and the area of the cutting blade at the tip of the drill bit was measured. Next, processing debris and the like were removed from the tip of the drill bit after hole boring processing of 6,000 hits, thereafter the blade edge of the drill bit was observed in the same manner as described above, and the area of the cutting blade where the drill bit tip was not worn was measured. The amount of wear at the drill bit tip was calculated from the following expression. All the area units are the same.

Amount of wear at drill bit tip (%)=[(area of cutting blade of drill bit before hole boring processing−area of cutting blade not worn after hole boring processing)/area of cutting blade of drill bit before hole boring processing]×100

The results are shown in Tables 4 and 5. In addition, a graph for comparison of the amount of wear at the drill bit tip among respective Examples and Comparative Examples is illustrated in FIG. 9.

TABLE 3

| | | | Determination criteria | | | | |
|---|---|---|---|---|---|---|---|
| | | | Hole position accuracy | | | Winding of resin to drill bit | Amount of wear at drill bit tip |
| Comprehensive evaluation | | | 1500 hits | 3000 hits | 6000 hits | 6000 hits | 6000 hits |
| ★★★★★ | Excellent | Example | less than 20 μm | less than 22 μm | less than 26 μm | 0 mm³ | less than 52% |
| ★★★ | Good | Example | 20 μm or more less than 24 μm | 22 μm or more less than 26 μm | 26 μm or more less than 28 μm | more than 0 mm³ less than 0.5 mm³ | 52% or more less than 54% |
| ★★ | Fair | Comparative Example | 24 μm or more less than 28 μm | 26 μm or more less than 30 μm | 28 μm or more less than 30 μm | 0.5 mm³ or more less than 1.0 mm³ | 54% or more less than 56% |
| ★ | Poor | Comparative Example | 28 μm or more | 30 μm or more | 30 μm or more | 1.0 mm³ or more | 56% or more |

TABLE 4

| | Resin composition Kind | Solid lubricant Kind | Solid lubricant Content (parts by mass) | Hole position accuracy Ave. + 3σ 1500 hits (μm) | Hole position accuracy Ave. + 3σ 3000 hits (μm) | Hole position accuracy Ave. + 3σ 6000 hits (μm) | Amount of entangled resin around drill bit 6000 hits (mm³) | Amount of wear at drill bit tip 6000 hits (%) | Comprehensive evaluation |
|---|---|---|---|---|---|---|---|---|---|
| Example 1 | A | C | 10.0 | 20.1 | 23.0 | 25.9 | 0.42 | 51.4 | ★★★ |
| Example 2 | A | C | 20.0 | 19.3 | 21.0 | 25.1 | 0.26 | 52.5 | ★★★ |
| Example 3 | A | C | 40.0 | 19.2 | 22.0 | 24.5 | 0.10 | 51.0 | ★★★ |
| Example 4 | A | C | 50.0 | 18.5 | 20.5 | 23.9 | 0.10 | 50.3 | ★★★ |
| Example 5 | A | C | 60.0 | 20.4 | 22.4 | 27.9 | 0.06 | 51.1 | ★★★ |
| Example 6 | A | C | 80.0 | 19.2 | 21.5 | 26.8 | 0.04 | 49.1 | ★★★ |
| Example 7 | A | C | 100.0 | 20.8 | 23.1 | 27.8 | 0.02 | 47.4 | ★★★ |
| Example 8 | A | C | 150.0 | 20.5 | 24.4 | 27.6 | 0.00 | 49.5 | ★★★ |
| Example 9 | A | C | 200.0 | 21.7 | 23.8 | 27.8 | 0.00 | 50.9 | ★★★ |
| Example 10 | A | C + D | 50.0 + 5.0 | 19.2 | 21.2 | 27.4 | 0.08 | 51.3 | ★★★ |
| Example 11 | A | C + D | 50.0 + 10.0 | 18.9 | 21.8 | 27.1 | 0.07 | 52.1 | ★★★ |
| Example 12 | A | C + D | 50.0 + 25.0 | 22.4 | 25.1 | 26.1 | 0.05 | 51.0 | ★★★ |
| Example 13 | A | C + D | 50.0 + 50.0 | 23.8 | 25.3 | 25.0 | 0.00 | 50.5 | ★★★ |
| Example 14 | A | C + E | 50.0 + 5.0 | 21.0 | 23.3 | 24.5 | 0.09 | 53.1 | ★★★ |
| Example 15 | A | C + E | 50.0 + 10.0 | 20.6 | 23.4 | 24.1 | 0.05 | 52.8 | ★★★ |
| Example 16 | A | C + E | 50.0 + 25.0 | 18.7 | 20.6 | 24.7 | 0.03 | 52.1 | ★★★ |
| Example 17 | A | C + E | 50.0 + 50.0 | 16.5 | 19.0 | 23.5 | 0.00 | 51.2 | ★★★★ |
| Example 18 | A | C + E | 50.0 + 100.0 | 18.5 | 20.1 | 24.5 | 0.00 | 51.9 | ★★★★ |
| Example 19 | A | C + E | 50.0 + 150.0 | 20.6 | 22.8 | 26.7 | 0.00 | 51.9 | ★★★ |
| Example 20 | A | C + E | 5.0 + 45.0 | 18.4 | 19.9 | 23.2 | 0.12 | 52.6 | ★★★ |
| Example 21 | A | C + E | 10.0 + 40.0 | 18 | 19.5 | 22.8 | 0.11 | 49.9 | ★★★★ |
| Example 22 | A | C + E | 25.0 + 25.0 | 16.7 | 19.3 | 21.9 | 0.12 | 50.2 | ★★★★ |
| Example 23 | A | C + E | 40.0 + 10.0 | 17.0 | 19.7 | 23.4 | 0.11 | 51.6 | ★★★★ |
| Example 24 | A | C + E | 45.0 + 5.0 | 19.8 | 20.2 | 25.6 | 0.10 | 52.1 | ★★★ |

TABLE 5

| | Resin composition Kind | Solid lubricant Kind | Solid lubricant Content (parts by mass) | Hole position accuracy Ave. + 3σ 1500 hits (μm) | Hole position accuracy Ave. + 3σ 3000 hits (μm) | Hole position accuracy Ave. + 3σ 6000 hits (μm) | Amount of entangled resin around drill bit 6000 hits (mm³) | Amount of wear at drill bit tip 6000 hits (%) | Comprehensive evaluation |
|---|---|---|---|---|---|---|---|---|---|
| Comparative Example 1 | A | B | 0.0 | 27.7 | 29.1 | 34.0 | 0.63 | 55.9 | ★ |
| Comparative Example 2 | A | C | 2.0 | 26.8 | 29.1 | 34.0 | 0.57 | 55.2 | ★ |
| Comparative Example 3 | A | C | 5.0 | 25.8 | 27.6 | 31.9 | 0.72 | 52.4 | ★ |
| Comparative Example 4 | A | D | 20.0 | 26.7 | 28.0 | 31.5 | 0.17 | 54.5 | ★ |
| Comparative Example 5 | A | D | 80.0 | 24.1 | 26.0 | 29.5 | 0.00 | 51.8 | ★★ |
| Comparative Example 6 | A | E | 20.0 | 19.1 | 20.8 | 29.8 | 0.08 | 52.3 | ★★ |
| Comparative Example 7 | A | E | 80.0 | 17.7 | 19.8 | 29.0 | 0.00 | 52.2 | ★★ |
| Comparative Example 8 | A | F | 5.0 | 23.5 | 25.5 | 29.6 | 0.65 | 55.2 | ★★ |
| Comparative Example 9 | A | F | 10.0 | 24.7 | 25.5 | 30.9 | 0.42 | 53.9 | ★ |
| Comparative Example 10 | A | F | 20.0 | 26.9 | 27.7 | 30.6 | 0.13 | 52.1 | ★ |
| Comparative Example 11 | A | F | 50.0 | 29.9 | 31.0 | 34.8 | 0.03 | 53.1 | ★ |
| Comparative Example 12 | A | F | 100.0 | 28.9 | 30.5 | 34.7 | 0.00 | 52.0 | ★ |
| Comparative Example 13 | A | F | 200.0 | 39.5 | 47.9 | 52.9 | 0.00 | 51.1 | ★ |
| Comparative Example 14 | A | G | 5.0 | 27.9 | 29.5 | 31.8 | 0.51 | 55.0 | ★ |
| Comparative Example 15 | A | G | 10.0 | 26.9 | 28.1 | 32.2 | 0.46 | 53.5 | ★ |

TABLE 5-continued

| | Solid lubricant | | Hole position accuracy Ave. + 3σ | | | Amount of entangled resin around drill bit | Amount of wear at drill bit tip | |
|---|---|---|---|---|---|---|---|---|
| | Resin composition Kind | Kind | Content (parts by mass) | 1500 hits (μm) | 3000 hits (μm) | 6000 hits (μm) | 6000 hits (mm³) | 6000 hits (%) | Comprehensive evaluation |
| Comparative Example 16 | A | G | 20.0 | 28.5 | 29.2 | 35.4 | 0.32 | 53.4 | ★ |
| Comparative Example 17 | A | G | 50.0 | 29.1 | 31.3 | 36.1 | 0.12 | 54.1 | ★ |
| Comparative Example 18 | A | G | 100.0 | 31.1 | 32.5 | 37.6 | 0.08 | 52.3 | ★ |
| Comparative Example 19 | A | G | 200.0 | 40.2 | 44.2 | 49.5 | 0.00 | 52.0 | ★ |

As shown in Table 4 and Table 5, it was found that 10 parts by mass to 200 parts by mass of the tungsten disulfide as a solid lubricant was added based on 100 parts by mass of the resin in the resin composition to thereby result in remarkable enhancement in hole position accuracy. In addition, it was found that the difference in hole position accuracy between Example 1 and Comparative Example 1 was studied in terms of the life of a drill bit and the life of a drill bit in Example 1 where the tungsten disulfide was used corresponded to 4 times or more the life of a drill bit in Comparative Example 1 where the tungsten disulfide was not added. In addition, it was found that the life of a drill bit in Example 1 where the tungsten disulfide was used could also be extended 4 times or more the life of a drill bit in each of Comparative Examples 8 to 13 where the molybdenum disulfide was used and Comparative Examples 14 to 19 where the molybdenum trioxide was used. Moreover, it was found that the life of a drill bit in each of Examples 10 to 24 where the tungsten disulfide and the molybdenum disulfide or the graphite were used in combination as solid lubricants could also be extended 4 times or more. In particular, it was found that when the tungsten disulfide and the graphite were used in combination as solid lubricants, the life of a drill bit could be further extended, and when the tungsten disulfide and the graphite were used in combination in a mass ratio of 10:90 to 90:10, the life of a drill bit could be still further extended. The effort for enhancement in hole position accuracy by 1 μm was heretofore made, but even those skilled in the arts could not expect the results of the present invention: achievement of such remarkable enhancement in hole position accuracy. In addition, as shown by the results in Table 4 and Table 5, it was found that the entry sheet for drilling where the tungsten disulfide was used as a solid lubricant realized a remarkably excellent hole position accuracy even at any number of cumulative holes bored.

It was found from the results in Table 4 and Table 5 that the entry sheet in each of Examples 1 to 24 was excellent in hole position accuracy at both the stage where drill bit wearing did not progress and the stage where such wearing progressed, as compared with the entry sheet in each of Comparative Examples 1 to 19. It has been found that the amount of the tungsten disulfide to be added is optimized within the scope of the present invention to thereby allow the entry sheet for drilling of the present invention, to which the tungsten disulfide is added, to be remarkably excellent in hole position accuracy as compared with a conventional entry sheet for drilling, to which the molybdenum disulfide, zinc molybdate or molybdenum trioxide is added.

The present application is based on Japanese Patent Application (Japanese Patent Application No. 2014-072337) filed on Mar. 31, 2014, the content of which is herein incorporated by reference.

The present invention can provide an entry sheet for drilling, which is excellent in hole position accuracy and enables to reduce drill bit breakage as compared with a conventional entry sheet for drilling.

REFERENCE SIGNS LIST

A: drill bit, B: crystal of water-soluble resin (A), C: metal foil, D: centripetal force, E: solid lubricant.

The invention claimed is:

1. An entry sheet for drilling, comprising a metal foil, and a layer comprising a resin composition and formed on at least one surface of the metal foil, wherein
the resin composition comprises a resin, tungsten disulfide as a solid lubricant, and a water-soluble resin (A), and
the content of the tungsten disulfide included in the resin composition is 10 parts by mass to 200 parts by mass based on 100 parts by mass of the resin included in the resin composition,
wherein the water-soluble resin (A) includes one or more selected from the group consisting of polyethylene oxide, polypropylene oxide, polyethylene glycol, and polypropylene glycol.

2. The entry sheet for drilling according to claim 1, wherein the resin composition further comprises a solid lubricant that is different from the tungsten disulfide.

3. The entry sheet for drilling according to claim 2, wherein the resin composition comprises graphite as the solid lubricant that is different from the tungsten disulfide.

4. The entry sheet for drilling according to claim 1, wherein a particle diameter at a maximum peak in a particle size distribution curve of the tungsten disulfide, measured with a laser diffraction particle size distribution measurement apparatus, is 1 to 20 μm.

5. The entry sheet for drilling according to claim 1, wherein the layer comprising the resin composition has a thickness in the range from 0.02 to 0.3 mm.

6. The entry sheet for drilling according to claim 1, wherein the resin composition comprises a thermoplastic water-insoluble resin.

7. The entry sheet for drilling according to claim 6, wherein the thermoplastic water-insoluble resin is one or more selected from the group consisting of an amide-based elastomer, a butadiene-based elastomer, an ester-based elastomer, an olefin-based elastomer, a urethane-based elastomer, a styrene-based elastomer, polybutene, low density polyethylene, chlorinated polyethylene, a metallocene-based polyolefin resin, an ethylene/acrylic acid ester/maleic anhydride copolymer, an ethylene/glycidyl (meth)acrylate copolymer, an ethylene/vinyl acetate copolymerization resin, a modified-ethylene/vinyl acetate copolymerization resin, an ethylene/(meth)acrylic acid copolymerization resin, an ionomer resin, and an ethylene/(meth)acrylic acid ester copolymerization resin.

8. The entry sheet for drilling according to claim 1, wherein the resin composition comprises a water-insoluble lubricant that is not a solid lubricant.

9. The entry sheet for drilling according to claim 8, wherein the water-insoluble lubricant that is not a solid lubricant is one or more selected from the group consisting of an amide-based compound, a fatty acid-based compound, a fatty acid ester-based compound, an aliphatic hydrocarbon-based compound and a higher aliphatic alcohol.

10. The entry sheet for drilling according to claim 1, wherein the metal foil has a thickness in the range from 0.05 to 0.5 mm.

11. The entry sheet for drilling according to claim 1, comprising an adhesion layer in a form of a resin film between the metal foil and the layer comprising the resin composition, and the resin film has a thickness in the range from 0.002 to 0.02 mm.

12. The entry sheet for drilling according to claim 11, wherein the resin film comprises 1 part by mass to 50 parts by mass of tungsten disulfide as a solid lubricant based on 100 parts by mass of the resin included in the resin film.

13. The entry sheet for drilling according to claim 1, for use in hole boring processing by a drill bit having a diameter of 0.30 mmφ or less.

14. The entry sheet for drilling according to claim 1, for use in drilling processing of a laminate or a multilayer board.

15. The entry sheet for drilling according to claim 2, wherein a particle diameter at a maximum peak in a particle size distribution curve of the tungsten disulfide, measured with a laser diffraction particle size distribution measurement apparatus, is 1 to 20 μm.

16. The entry sheet for drilling according to claim 2, wherein the layer comprising the resin composition has a thickness in the range from 0.02 to 0.3 mm.

17. The entry sheet for drilling according to claim 2, wherein the resin composition comprises a thermoplastic water-insoluble resin.

18. A laminate structure comprising:
a substrate having an upper surface, the substrate including at least one of a laminate and a multilayer board for a printed wiring board; and
an entry sheet for drilling positioned on the upper surface of the substrate, the entry sheet including a metal foil and a layer comprising a resin composition formed on at least one surface of the metal foil,
wherein the resin composition includes a resin, tungsten disulfide as a solid lubricant, and a water-soluble resin (A), wherein the content of the tungsten disulfide included in the resin composition is 10 parts by mass to 200 parts by mass based on 100 parts by mass of the resin included in the resin composition, and the water-soluble resin (A) includes one or more selected from the group consisting of polyethylene oxide, polypropylene oxide, polyethylene glycol, and polypropylene glycol.

* * * * *